(12) United States Patent  
Tronnes et al.

(10) Patent No.: US 7,875,804 B1
(45) Date of Patent: Jan. 25, 2011

(54) PLATED GROUND FEATURES FOR INTEGRATED LEAD SUSPENSIONS

(75) Inventors: Jeffrey M. Tronnes, Hutchinson, MN (US); Cedar Decker, Hutchinson, MN (US); Brett L. Haugen, Hutchinson, MN (US)

(73) Assignee: Hutchinson Technology Incorporated, Hutchinson, MN (US)

( * ) Notice: Subject to any disclaimer, the term of this patent is extended or adjusted under 35 U.S.C. 154(b) by 1153 days.

(21) Appl. No.: 11/535,712

(22) Filed: Sep. 27, 2006

(51) Int. Cl.
*H05K 1/00* (2006.01)
(52) U.S. Cl. ............... 174/254; 174/262; 361/749
(58) Field of Classification Search ........... 174/254, 174/262–266; 361/749–751
See application file for complete search history.

(56) References Cited

U.S. PATENT DOCUMENTS

| | | | |
|---|---|---|---|
| 4,109,297 A | 8/1978 | Lesh et al. | |
| 4,761,699 A | 8/1988 | Ainslie et al. | |
| 4,764,260 A | 8/1988 | Gay et al. | |
| 4,764,620 A | 8/1988 | Logusch | |
| 4,855,871 A | 8/1989 | Young | |
| 5,408,052 A * | 4/1995 | Inaba et al. | 174/261 |
| 6,082,610 A | 7/2000 | Shangguan et al. | |
| 6,117,299 A | 9/2000 | Rinne et al. | |
| 6,246,548 B1 | 6/2001 | Williams | |
| 6,518,182 B1 | 2/2003 | Ishikawa et al. | |
| 6,576,549 B2 | 6/2003 | Egitto et al. | |
| 6,580,036 B2 | 6/2003 | Kim et al. | |
| 6,647,621 B1 | 11/2003 | Roen et al. | |
| 6,700,748 B1 | 3/2004 | Cowles et al. | |
| 7,064,928 B2 | 6/2006 | Fu et al. | |
| 7,571,540 B2 * | 8/2009 | Aonuma et al. | 29/846 |

OTHER PUBLICATIONS

Non-final Office Action for U.S. Appl. No. 10/782,746 dated Dec. 27, 2005; 14 pages.
Final Office Action for U.S. Appl. No. 10/782,746 dated Jul. 10, 2006; 12 pages.
Advisory Action for U.S. Appl. No. 10/782,746 dated Oct. 16, 2006; 3 pages.
Non-final Office Action for U.S. Appl. No. 10/782,746 dated Dec. 22, 2006; 12 pages.
Final Office Action for U.S. Appl. No. 10/782,746 dated Jun. 5, 2007; 15 pages.
Advisory Action for U.S. Appl. No. 10/782,746 dated Aug. 17, 2007; 3 pages.
Non-final Office Action for U.S. Appl. No. 10/782,746 dated Oct. 12, 2007; 20 pages.
Declaration of Keith Johnson, dated Mar. 27, 2008, 2 pages.

* cited by examiner

*Primary Examiner*—Jeremy C Norris
(74) *Attorney, Agent, or Firm*—Faegre & Benson LLP

(57) ABSTRACT

A method for forming an electrical interconnect on an integrated lead suspension or suspension component of the type having a stainless steel layer, a conductive lead layer and an insulator layer separating the stainless steel and conductive lead layers. An aperture is formed through only the insulator layer to expose the stainless steel layer at an interconnect site. An interconnect mask is applied around the interconnect site. A first conductive material is electroplated onto the stainless steel layer at the interconnect site to form a plated interconnect between the spring metal layer and the conductive lead layer. The mask is then removed. An electrical interconnect between the stainless steel and conductive lead layers including an aperture only through the insulator layer and an electroplated conductive material interconnect extending between both the spring metal layer and the conductive lead layer.

18 Claims, 15 Drawing Sheets

US 7,875,804 B1

PLATED GROUND FEATURES FOR INTEGRATED LEAD SUSPENSIONS

FIELD OF THE INVENTION

The invention relates generally to integrated lead or wireless suspensions for disk drive assemblies. In particular, the invention is an electrical interconnect such as a ground feature formed on the integrated lead suspensions.

BACKGROUND OF THE INVENTION

Integrated lead or wireless suspensions and flexures (i.e., suspension components) are used to support read/write transducers in disk drives or other dynamic data storage systems. These devices typically have a stainless steel or other spring metal layer for supporting the electrical traces. A layer of dielectric insulating material separates the traces from the stainless steel.

Electrical connections between otherwise isolated conductors on suspension assemblies (e.g., between the conductor and stainless steel layers) can be created by applying a conductive epoxy material into a via or through hole extending through at least some of the layers. This interconnect can be formed using a screen printing process. The conductive epoxy material provides an acceptable connection in some applications, for example, ground applications. Creating a good connection between the epoxy material and the stainless steel surface of the suspension assembly, however, has proven to be difficult because the stainless steel surface often has an adhered layer of oxidation on its surface, which prevents a good electrical connection.

Printed circuit boards used in electronic assemblies often have more than one level of electric conductors separated by an insulative material such as fiberglass. Plated vias or through holes connect the conductors on different layers. The plating process used to plate vias or through holes involves metalizing the dielectric inside the holes using an electroless process and then electroplating on top of the electroless to create conductivity between the conductor layers through the via or through hole.

Unfortunately, the circuit board interconnect process does not work well for a suspension assembly because the metal applied using the electroless process does not adhere well to the stainless steel material on the suspension assembly. The electroless process, therefore, tends to create undesirable particulate. The process is also relatively expensive.

There is, therefore, a need for an effective method of applying conductive material to a suspension assembly to provide a reliable connection between two conductive surfaces that are otherwise isolated from each other. Any such method must be capable of producing high-quality electrical contacts. It should also be efficient to manufacture.

SUMMARY OF THE INVENTION

The present invention is a method for forming high-quality electrical interconnects on an integrated lead suspension or suspension component of the type having a spring metal layer, a conductive lead layer, and an insulator layer separating portions of the spring metal and conductive lead layers. An aperture is formed through only the insulator layer to expose the spring metal layer at an interconnect site. An interconnect mask is applied around the interconnect site. A first conductive material is electroplated on the spring metal layer at the interconnect site to form a plated interconnect between the spring metal layer and the conductive lead layer. The interconnect mask is then removed. One embodiment includes electroplating the first conductive material onto the conductive lead layer at the interconnect site.

DETAILED DESCRIPTION OF THE PREFERRED EMBODIMENTS

Figure 1:
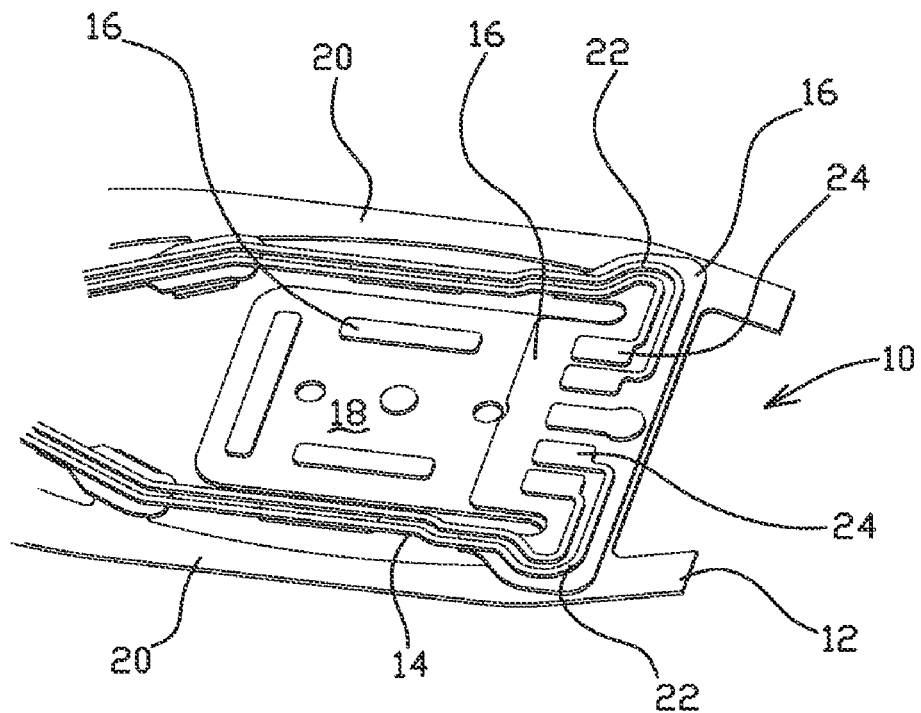
FIG. 1 is an isometric illustration of a first side of a portion of a first flexure on which electrical interconnects in accordance with the present invention can be fabricated.
Figure 2:
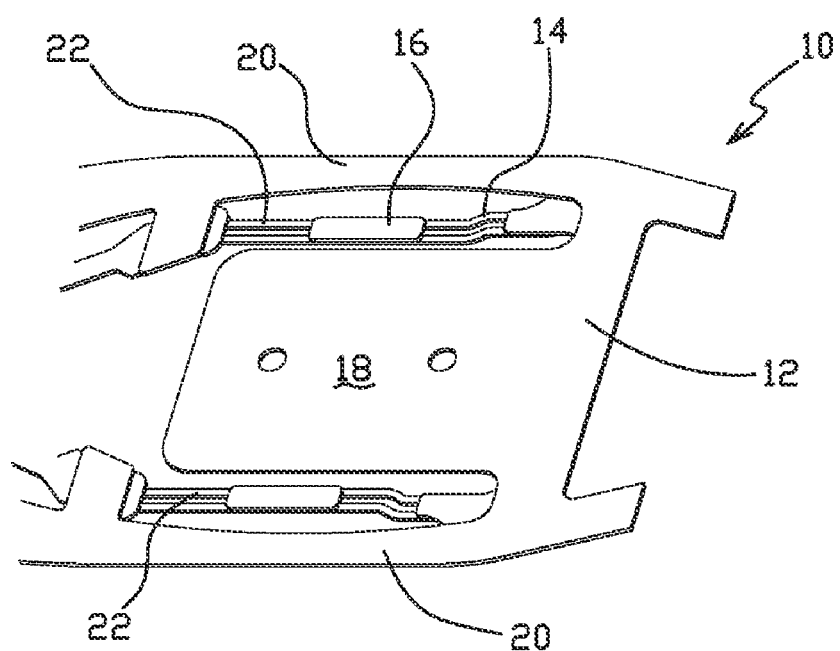
FIG. 2 is an isometric illustration of a second side of the portion of the flexure shown in FIG. 1.

FIGS. 1 and 2 are illustrations of the opposite sides of a portion of a wireless or integrated lead flexure 10 (i.e., a suspension component) on which interconnects in accordance with the present invention can be fabricated. The "lead" or "copper" side of the flexure is shown in FIG. 1, and the "stainless steel" side is shown in FIG. 2. The flexure 10 is formed from a laminated sheet of material including a spring metal layer 12 and a conductor layer 14 separated by a dielectric insulator layer 16. The spring metal layer, which is typically stainless steel (a conductive material), is formed into structural portions such as tongue 18 and side spring arms 20. The conductor layer 14, which is often copper or copper alloy, is formed into a number of integrated traces or leads 22. Leads 22 terminate at the end of the tongue 18 at bond pads 24. Portions of the insulator layer 16 are also removed, but generally remain at locations where the leads 22 overlay the spring metal layer 12. Flexures such as 10 are generally known and commercially available from a number of manufacturers including Hutchinson Technology Incorporated of Hutchinson, Minn. In preferred embodiments the flexure 10 is manufactured from a laminated sheet of material using conventional or otherwise known photolithography and etching processes. However, the interconnects in accordance with the invention can be incorporated into other types of suspensions and suspension components, including those manufactured by other processes.

Figure 3:
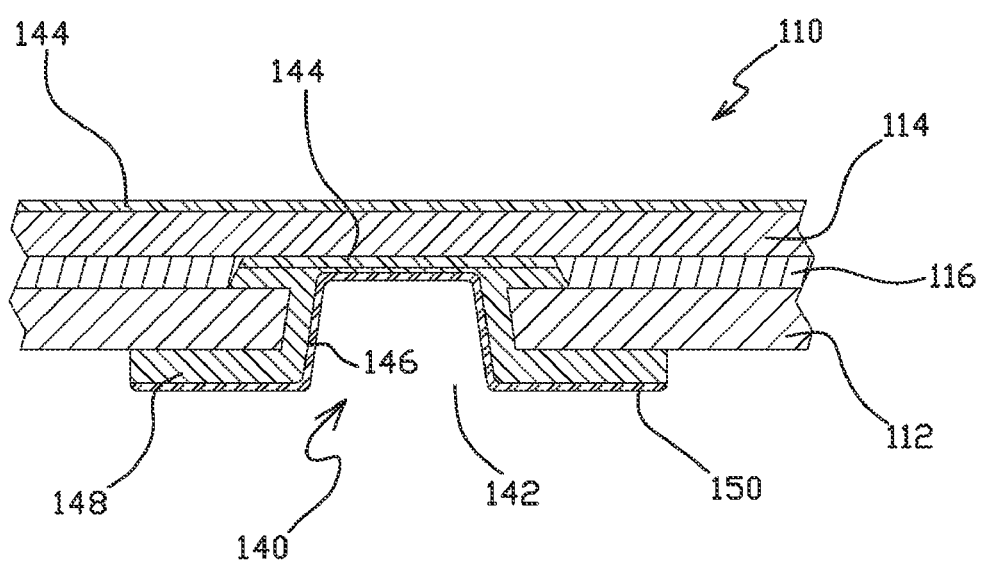
FIG. 3 is a detailed cross sectional illustration of a flexure similar to that shown in FIGS. 1 and 2 including an electrical interconnect in accordance with a first embodiment of the present invention.
Figure 4:
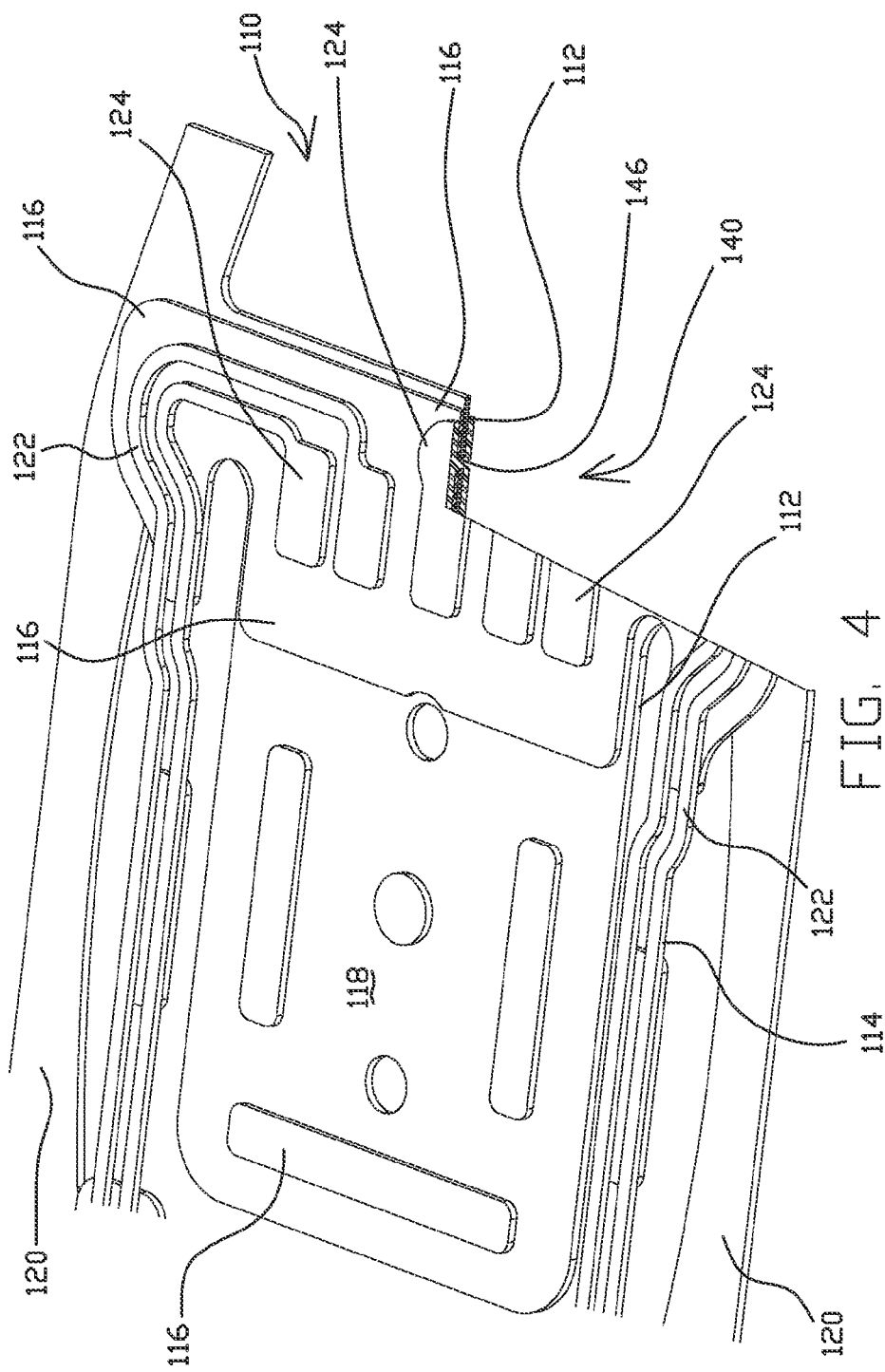
FIG. 4 is a cross sectional and isometric illustration of a first side of a portion of the flexure and electrical interconnect shown in FIG. 3.
Figure 5:
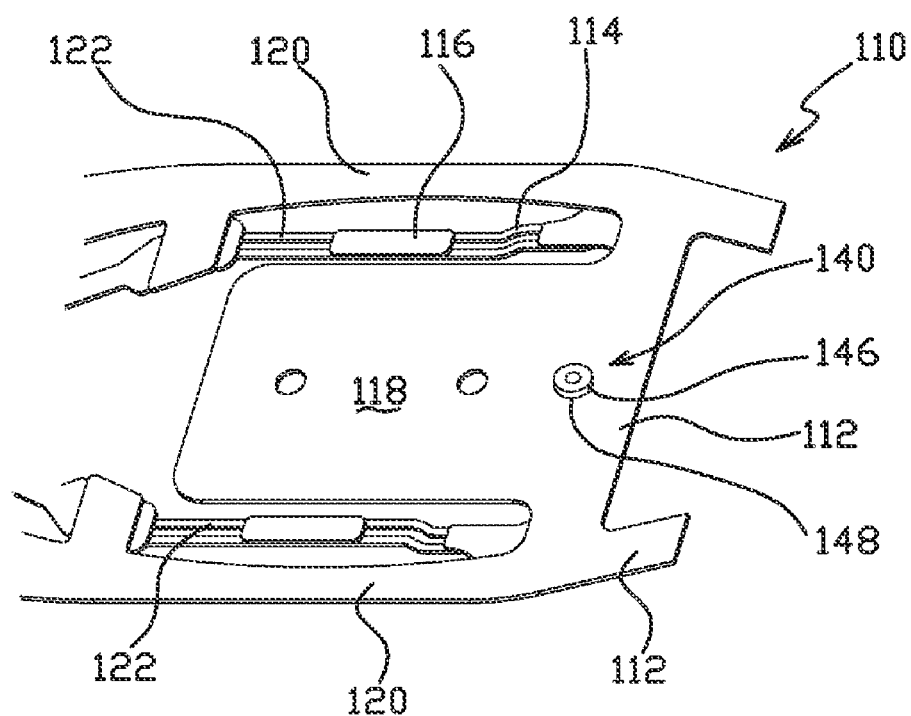
FIG. 5 is a cross sectional and isometric illustration of a second side of the portion of the flexure and electrical interconnect shown in FIG. 3.

FIGS. 3, 4 and 5 are illustrations of an interconnect 140 in accordance with a first embodiment of the present invention formed on the side of the spring metal layer 112 of flexure 110 (i.e., a "stainless steel side" interconnect). With the exception of interconnect 140, flexure 110 can be identical to flexure 10 described above, and similar reference numerals are used to identify corresponding features. As shown, the interconnect 140 is formed in an aperture 142 through the spring metal layer 112 and the insulator layer 116. The portion of aperture 142 extending through the insulator layer 116 is larger in diameter than the portion of the aperture extending through the spring metal layer 112 in the illustrated embodiment, but can be larger or smaller than the portion of the aperture through the spring metal layer in other embodiments. In the embodiment shown in FIG. 3, the surface of the conductor layer 114 exposed by the aperture 142 is plated with a relatively non-corrosive conductive material such as gold plating 144. Another embodiment (not shown) has a thin layer of nickel plated onto the conductor layer before the layer of gold is plated. Other surfaces of the conductor layer 114 forming leads 122 are also typically covered with gold plating 144 if the conductor layer is a relatively corrosive material. Other embodiments of the invention (not shown) do not include plating 144 (e.g., it is not needed if the conductor layer 114 is a relatively non-corrosive material, or if corrosion of the conductor layer is not a potential problem). An electroplated nickel or other conductive material interconnect plating 146 is built up or plated up over the spring metal layer 112 in the area of the aperture 142 to such an extent that it forms an electrical contact with the adjacent portion of the conductor layer 114 (through the plating 144 in the illustrated embodiment). As shown, the interconnect plating 146 fills the space between the spring metal layer 112 and the conductor layer 114 (or the plating 144 in the illustrated embodiment) within the aperture 142. As shown in FIG. 5, the portion of the interconnect plating 146 over the exterior surface of the spring metal layer 112 is formed into a small plug 148. As shown in FIG. 3, a layer of gold plating 150 can be applied to the interconnect plating 146 if corrosion is a potential problem.

Figure 6:
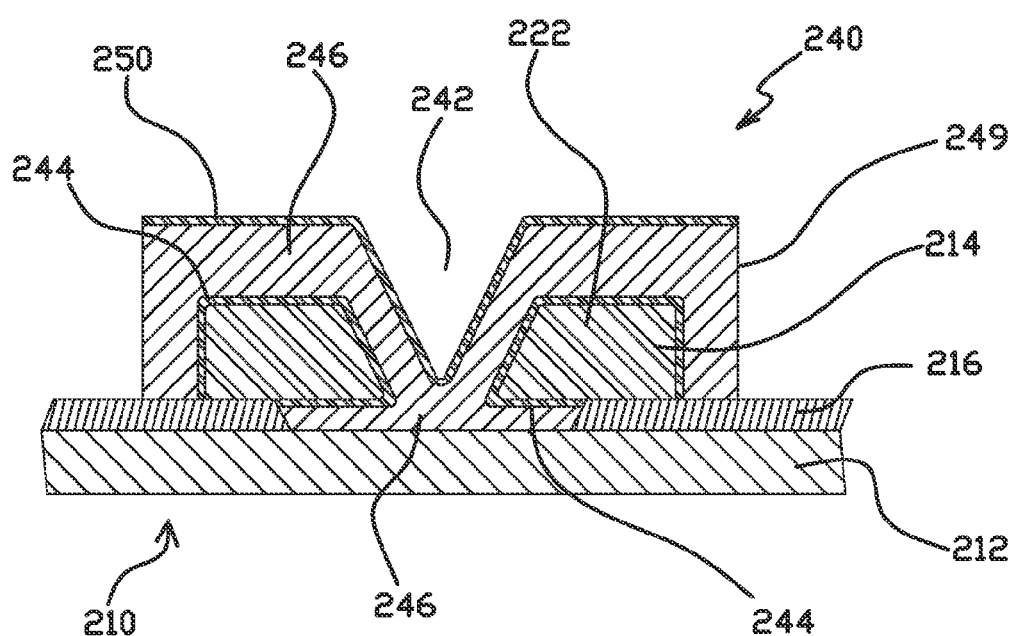
FIG. 6 is a detailed cross sectional illustration of a flexure similar to that shown in FIGS. 1 and 2 including an electrical interconnect in accordance with a second embodiment of the present invention.
Figure 7:
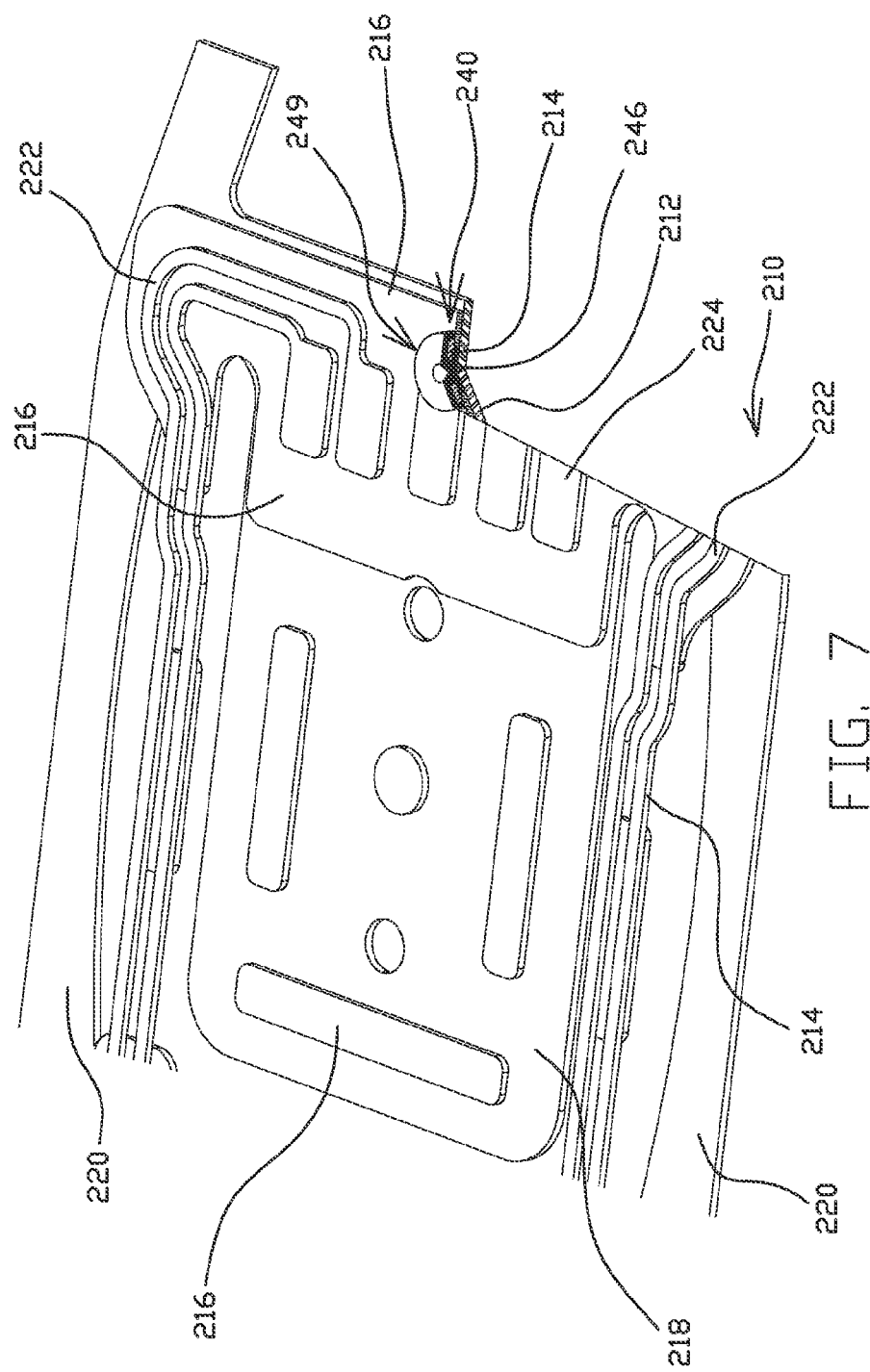
FIG. 7 is a cross sectional and isometric illustration of a first side portion of the flexure and electrical interconnect shown in FIG. 6.
Figure 8:
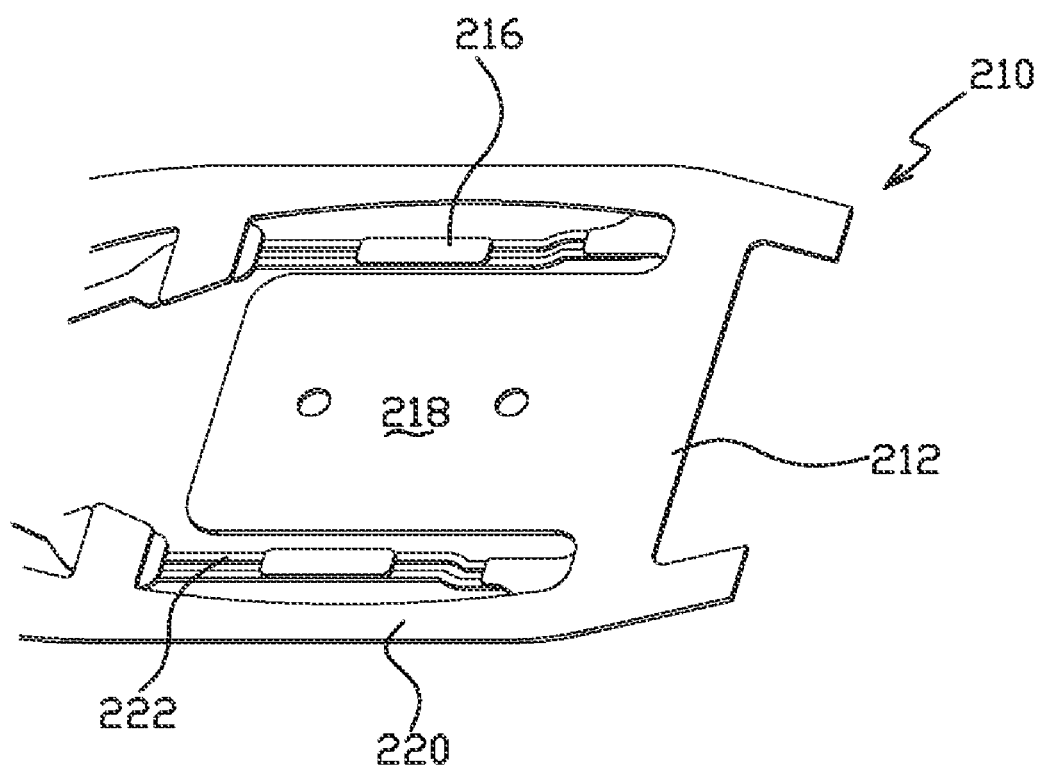
FIG. 8 is a cross sectional and isometric illustration of a second side of the portion of the flexure and electrical interconnect shown in FIG. 6.

FIGS. 6, 7 and 8 are illustrations of an interconnect 240 in accordance with a second embodiment of the present invention formed on the side of the conductor layer 214 of flexure 210 (i.e., a "copper side" interconnect). With the exception of interconnect 240, flexure 210 can be identical to flexure 10 described above, and similar reference numerals are used to identify corresponding features. As shown, the interconnect 240 is formed in an aperture 242 through the conductor layer 214 and the insulator layer 216. The portion of aperture 242 extending through the insulator layer 216 is larger in diameter than the portion of the aperture extending through the conductor layer 214 in the illustrated embodiment, but can be larger or smaller than the portion of the aperture through the conductor layer in other embodiments. In the embodiment shown in FIG. 6, the surface of the conductor layer 214 exposed by the aperture 242, as well as other exposed surfaces of the conductor layer, are plated with a relatively non-corrosive conductive material such as gold plating 244. Another embodiment (not shown) has a thin layer of nickel plated onto the conductor layer before the layer of gold is plated. Other embodiments of the invention (not shown) do not include plating 244 (e.g., it is not needed if the conductor layer 214 is a relatively non-corrosive material, or if corrosion of the conductor layer is not a potential problem). An electroplated nickel or other conductive material interconnect plating 246 is built up or plated up over the spring metal layer 212 in the area of aperture 242 to such an extent that it forms an electrical contact with the adjacent portion of the conductor layer 214 (through the plating 244 in the illustrated embodiment). As shown, the interconnect plating 246 fills the space between the spring metal layer 212 and the conductor layer 214 (or the plating 244 in the illustrated embodiment) within the aperture 242. As shown in FIG. 7, the portion of the interconnect plating 246 over the exterior surface of the conductor layer 214 is formed into a small plug 249. Although the interconnect plating 246 extends over the sides of the leads 222 in the embodiment shown in FIG. 6, the outer edge of the interconnect plating can be over the outer surface of the leads (i.e., not contact the sides of the leads) in other embodiments (not shown). As is evident from FIG. 8, the illustrated embodiment of interconnect 240 need not include structure extending through the outer surface of the spring metal layer 212 opposite that of the conductor layer 214. As shown in FIG. 6, a layer of gold plating 250 can be applied to the interconnect plating 246 if corrosion of the interconnect plating is a potential problem.

Figure 9:
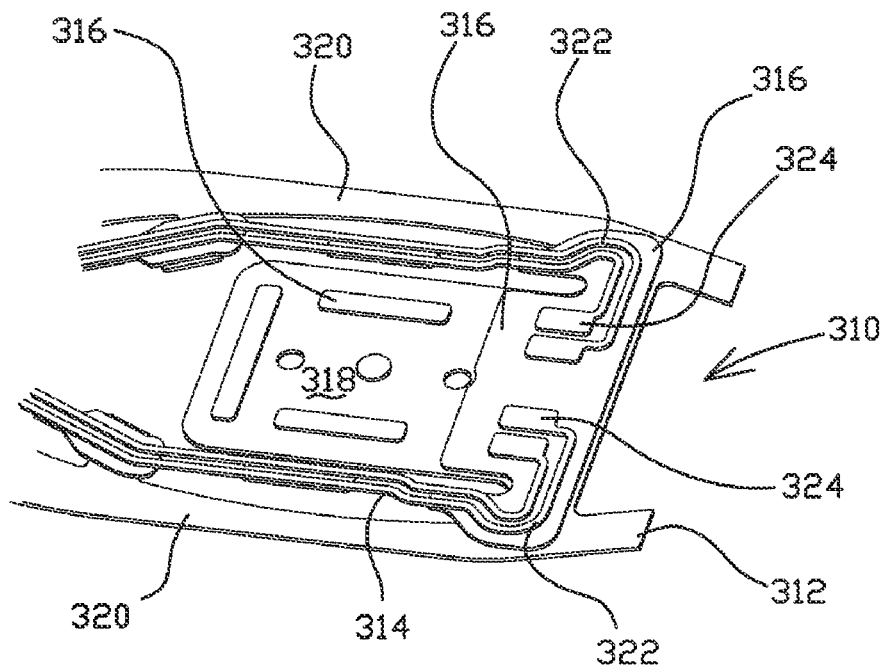
FIG. 9 is an isometric illustration of a first side of a portion of a second flexure on which electrical interconnects in accordance with the present invention can be fabricated.
Figure 10:
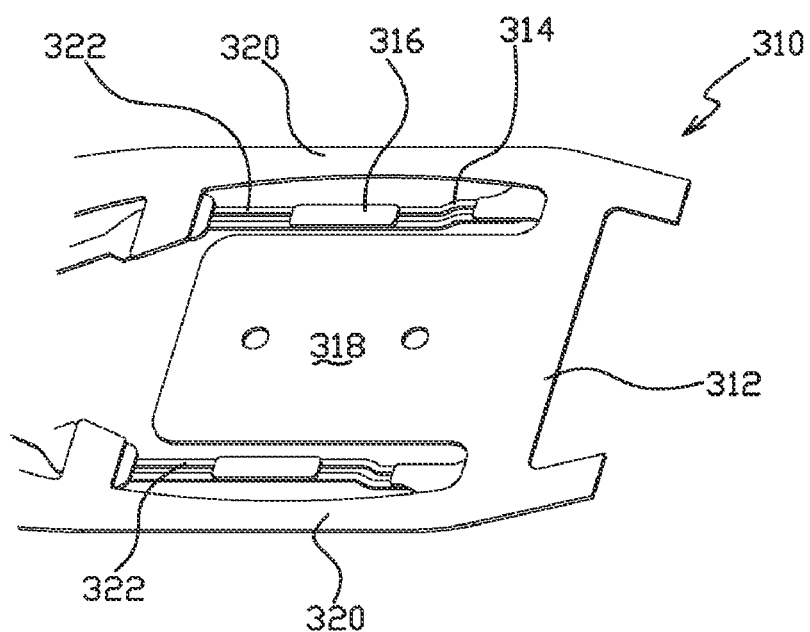
FIG. 10 is an isometric illustration of a second side of the portion of the flexure shown in FIG. 9.

FIGS. 9 and 10 are illustrations of the opposite sides of a portion of another wireless or integrated lead flexure 310 (i.e., a suspension component) on which interconnects in accordance with the present invention can be fabricated. With the exception of the lack of a bond pad (e.g., there is no center bond pad such as 324), flexure 310 can be identical to flexure 10 described above, and similar reference numerals are used to identify corresponding features.

Figure 11:
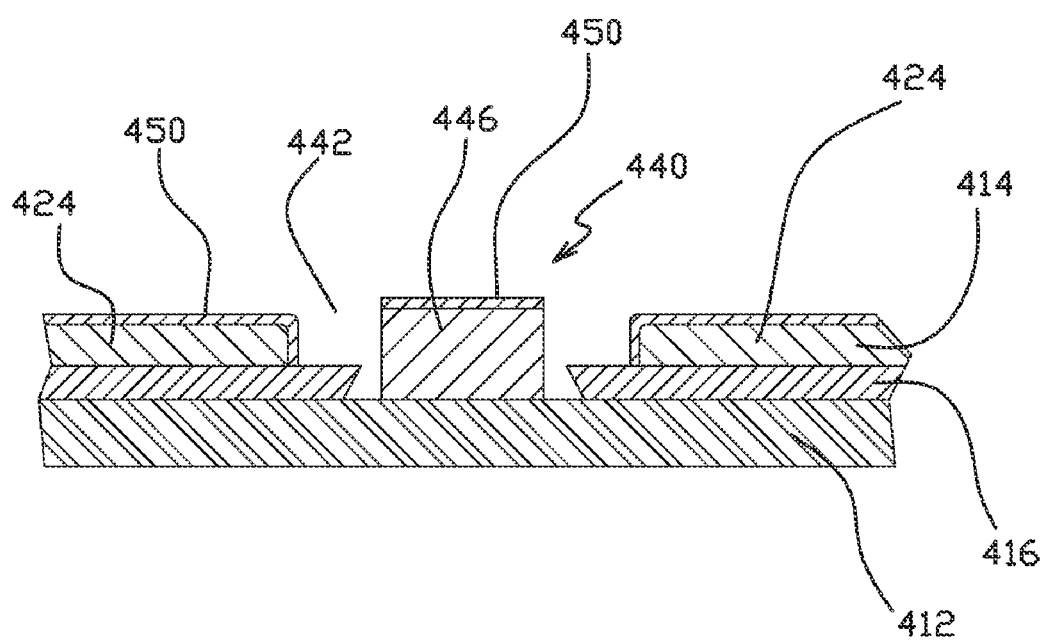
FIG. 11 is a detailed cross sectional illustration of a flexure similar to that shown in FIGS. 9 and 10 including an electrical interconnect in accordance with a third embodiment of the present invention.
Figure 12:
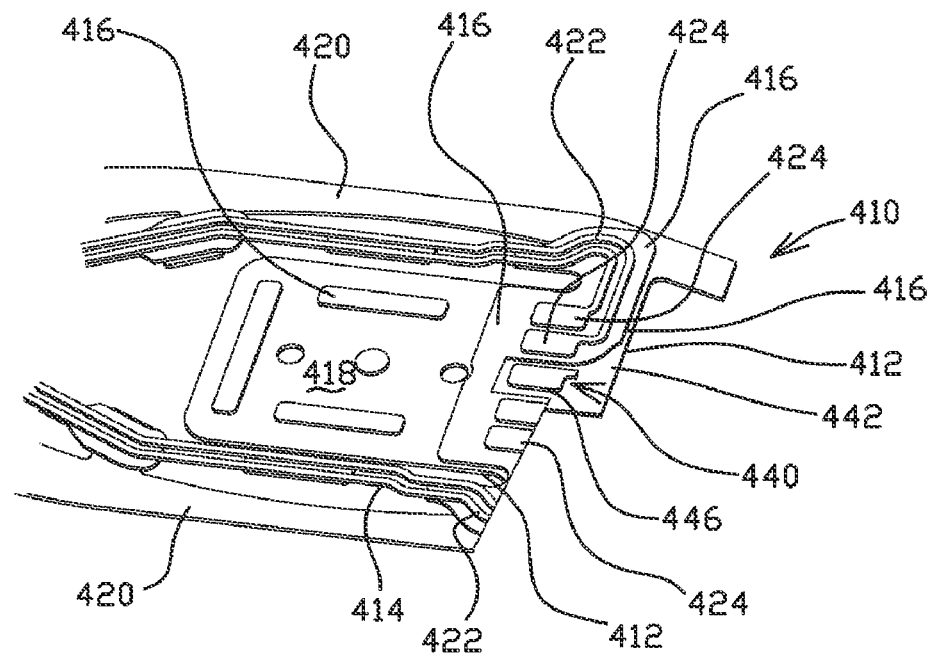
FIG. 12 is a cross sectional and isometric illustration of a first side of a portion of the flexure and electrical interconnect shown in FIG. 11.
Figure 13:
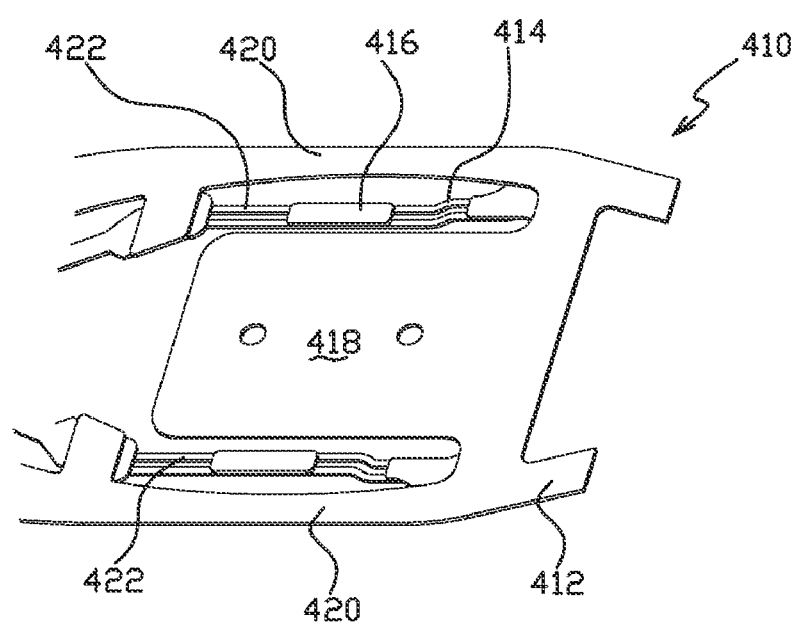
FIG. 13 is a cross sectional and isometric illustration of a second side of the portion of the flexure and electrical interconnect shown in FIG. 11.

FIGS. 11-13 are illustrations of a bond pad interconnect 440 in accordance with a third embodiment of the present invention formed on the side of the conductor layer 414 of flexure 410. With the exception of interconnect 440, flexure 410 can be identical to flexure 310 described above, and similar reference numerals are used to identify corresponding features. As shown, the bond pad interconnect 440 is formed in a gap or aperture 442 extending through the insulator layer 416 at the location of interconnect 440. An electroplated nickel or other conductive material interconnect plating 446 is built up or plated up over the spring metal layer 412 in the area of the aperture 442 corresponding to the desired location of the bond pad interconnect 440. As perhaps best shown in FIG. 11, the plating 446 of bond pad interconnect 440 is preferably built up to a height that is generally the same as the height of the other bond pads 424 on the flexure 410. The interconnect 440 is shaped to the desired size. As shown in FIG. 11, a layer of gold plating 450 can be applied to the interconnect plating 446 if corrosion of the interconnect plating is a potential problem.

Figure 14:
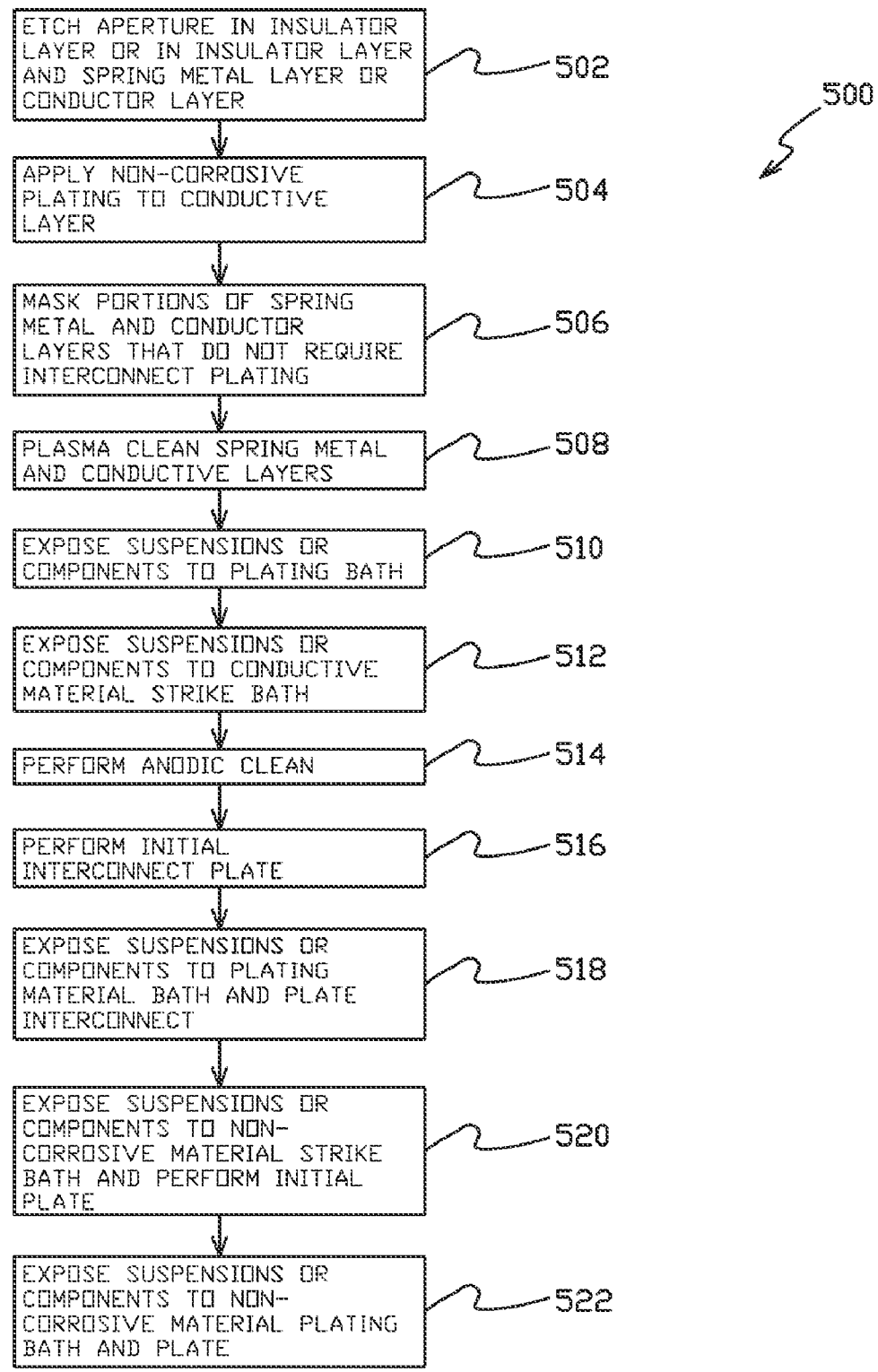
FIG. 14 is a block diagram illustration of a process for forming the interconnects shown in FIGS. 3-8 and 11-13.

FIG. 14 is a flowchart that generally describes a process 500 by which interconnects such as 140, 240 and 440 can be formed on flexures 110, 210 and 410, respectively. As shown at step 502, the interconnect forming process 500 includes etching or otherwise forming the gap or aperture 142, 242 or 442. With reference to interconnect 140 in particular, aperture 142 can be etched through the spring metal layer 112 and insulator layer 116 to expose the conductor layer 114 at the location of the interconnect. Similarly in the case of interconnect 240, aperture 242 is etched through the conductor layer 214 and insulator layer 216 to expose the spring metal layer 212 at the location of the interconnect. For bond pad interconnect 440, the aperture or gap 442 is etched through the insulator layer 416 to expose the spring metal layer 416 at the location of the interconnect. Conventional photolithography and chemical and/or plasma etching processes can be used to perform step 502. Furthermore, step 502 can be effectively performed during the formation of other structural features (e.g., leads, bond pads, tongue and spring arms) of the flexures 110, 210 or 410.

At step 504, any desired non-corrosive material such as gold or other plating 144 and 244 can be applied to exposed surfaces of the leads 122 and 222 formed in the conductor layer 114 and 214, respectively. Conventional electroplating processes can be used to perform step 504. In the embodiments illustrated in FIGS. 3 and 6, layers of plating 144 and 244 are applied to the exposed portions (i.e., top, bottom and sides) of the conductor layers 114 and 214 at the locations of interconnects 140 and 240.

An interconnect plating mask (not shown) is applied to the flexure at step 506. The plating mask is applied around the interconnect site, and preferably covers all the electrically interconnected portions of the spring metal layers 112, 212 and 412 and conductor layers 114, 214 and 414 of the flexures 110, 210, and 410, respectively, where the interconnect plating 146, 246 and 446 is not desired. Conventional or otherwise known photoresist and photomask processing techniques can be used to form the interconnect plating mask. With reference to the interconnect 140 shown in FIGS. 3-5, for example, the interconnect mask (not shown) would cover at least all exposed and electrically interconnected portions of the lead 122 and associated bond pad 124 to which the interconnect is being made (with the exception of the portion of the lead exposed by aperture 142), and all exposed and electrically interconnected surfaces of spring metal layer 112 (with the exception of the area surrounding aperture 142). Similarly, with reference to the interconnect 240 shown in FIGS. 6-8, the interconnect mask (not shown) would cover all exposed and electrically interconnected portions of the spring metal layer 212 (with the exception of the portion of the spring metal layer exposed by aperture 242), and all exposed and electrically interconnected surfaces of the lead 222 and associated bond pad 224 to which the interconnect is being made (with the exception of the area surrounding aperture 242). With reference to the bond pad interconnect 440 shown in FIGS. 11-13, the interconnect mask (not shown) would cover all exposed and electrically interconnected portions of the spring metal layer 442 (other than that corresponding to the footprint of the interconnect within aperture 442).

The masked suspension components can then be plasma cleaned as indicated at step 508. Conventional plasma cleaning processes can be used for this purpose. An additional cleaning process can be performed by immersing the masked suspension components in a bath of acid such as sulfuric acid, as shown at step 510. After the acid exposure step 510 the suspension components will typically be rinsed before further processing steps are performed.

As described in greater detail below, interconnects 140, 240 and 440 are formed by electroplating and building up the interconnect plating 146, 246 and 446 on the spring metal layer 112, 212 and 412, respectively. The adhesion of the interconnect plating to the spring metal layer can be enhanced by first removing any oxide that may have formed on the spring metal layer. Accordingly, in a preferred embodiment of the invention, an oxide removal step is performed before the interconnect plating is applied. One embodiment of the oxide removal step is performed when the suspension components are exposed to a conductive plating material strike bath as indicated at step 512. In one embodiment of the invention nickel is used as the interconnect plating 146, 246 and 446. Accordingly, in this embodiment the suspension components are submersed in a nickel sulfamate strike bath at step 512. An anodic clean step 514 can be performed to remove the oxide by applying a reverse polarity current flow to the spring metal layer 112, 212 and 412 at a level and time sufficient to remove or reduce any oxide to acceptable levels. Following the completion of anodic clean step 514, the polarity of the current flow through the spring metal layer 112, 212 and 412 can be reversed to cause an initial and typically thin layer of interconnect material 146, 246 and 446 to be plated onto the spring metal layer at the interconnect site as shown at step 516. After step 516, the suspension components will typically be withdrawn from the plating strike bath and rinsed before further processing steps are performed.

Interconnect forming process 500 continues with the suspension components submersed in a conductive plating material bath as indicated at step 518. In the embodiments described above where the interconnect plating 146, 246 and 446 is nickel, the plating bath can be nickel sulfamate. At step 518 electric current is applied to the spring metal layer 112, 212 and 412 in such a manner as to cause interconnect plating 146, 246 and 446 to plate onto the exposed portions of the spring metal layer 112, 212 and 412, respectively. The thickness of the interconnect plating 146, 246 and 446 will continue to increase with continued plating. With respect to interconnects 140 and 240, the interconnect plating 146 and 446, respectively, will build up on the spring metal layer 112 and 212 to a thickness at which it will contact the exposed conductor layer 114 and 214. This built up interconnect plating 146 and 246 will then form an electrical connection with the conductor layer 114 and 214 of the lead 122 and 222, respectively, to which the contact is being formed. With continued plating at step 518 the interconnect plating 146 and 246 will also plate onto and build up on the exposed portions of the conductor layer 114 and 214 at the interconnect site. For interconnects 140 and 240, the plating step 518 can be ended when the interconnect plating 146 and 246 has been built up to the desired thickness on the spring metal layer 112 and 212 and respective conductor layer 114 and 214. With respect to interconnect 440, step 518 is performed until the interconnect plating 446 has built up to the desired thickness. As shown in FIG. 11, the desired thickness of the interconnect plating 446 will typically be generally the same as the thickness of adjacent bond pads 424. After step 518, the suspension components will typically be withdrawn from the plating bath and rinsed before further processing steps are performed.

In the embodiment of interconnect forming process 500 shown in FIG. 12, a layer of non-corrosive material such as gold plating 150, 250 and 450 is applied to the interconnect plating 146, 246 and 446 of interconnects 140, 240 and 440, respectively. This gold plating 150, 250 and 450 can be applied by first electroplating a thin layer of gold on the interconnect plating 146, 246 and 446 in a strike bath and shown at step 520, and subsequently electroplating a thicker layer of gold on the interconnect plating in a plating bath as shown at step 522. Plating steps 520 and 522 can performed using conventional plating processes. Conventional masking and photolithography processes can be used to remove the interconnect masks from the components after the interconnects have be formed.

Figure 15:
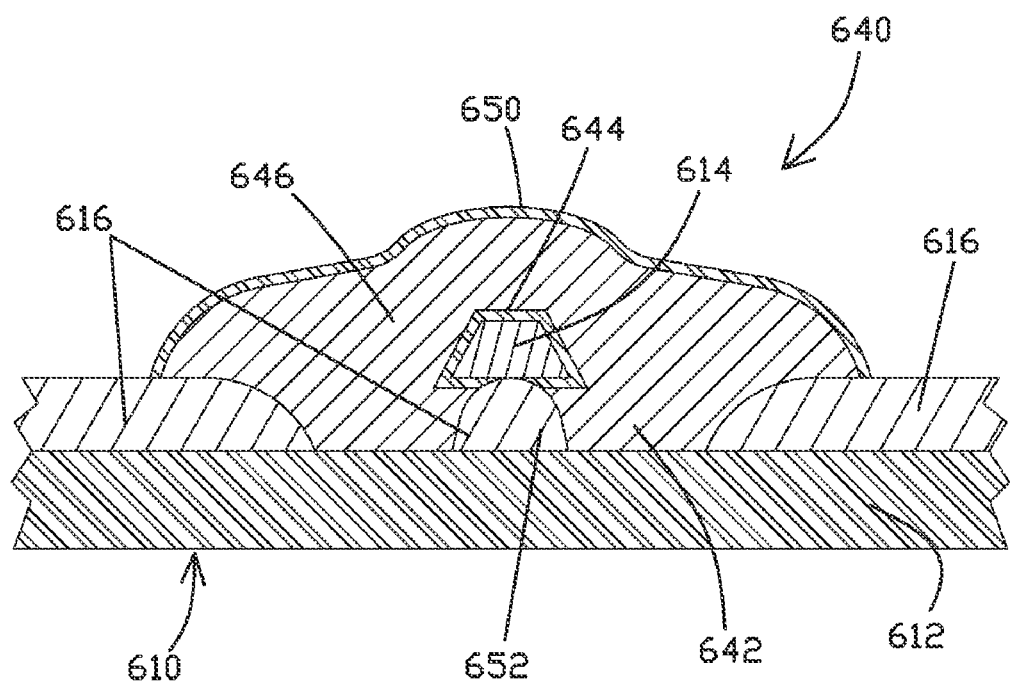
FIG. 15 is a detailed cross sectional illustration of a flexure including an electrical interconnect in accordance with a fourth embodiment of the present invention.
Figure 16:
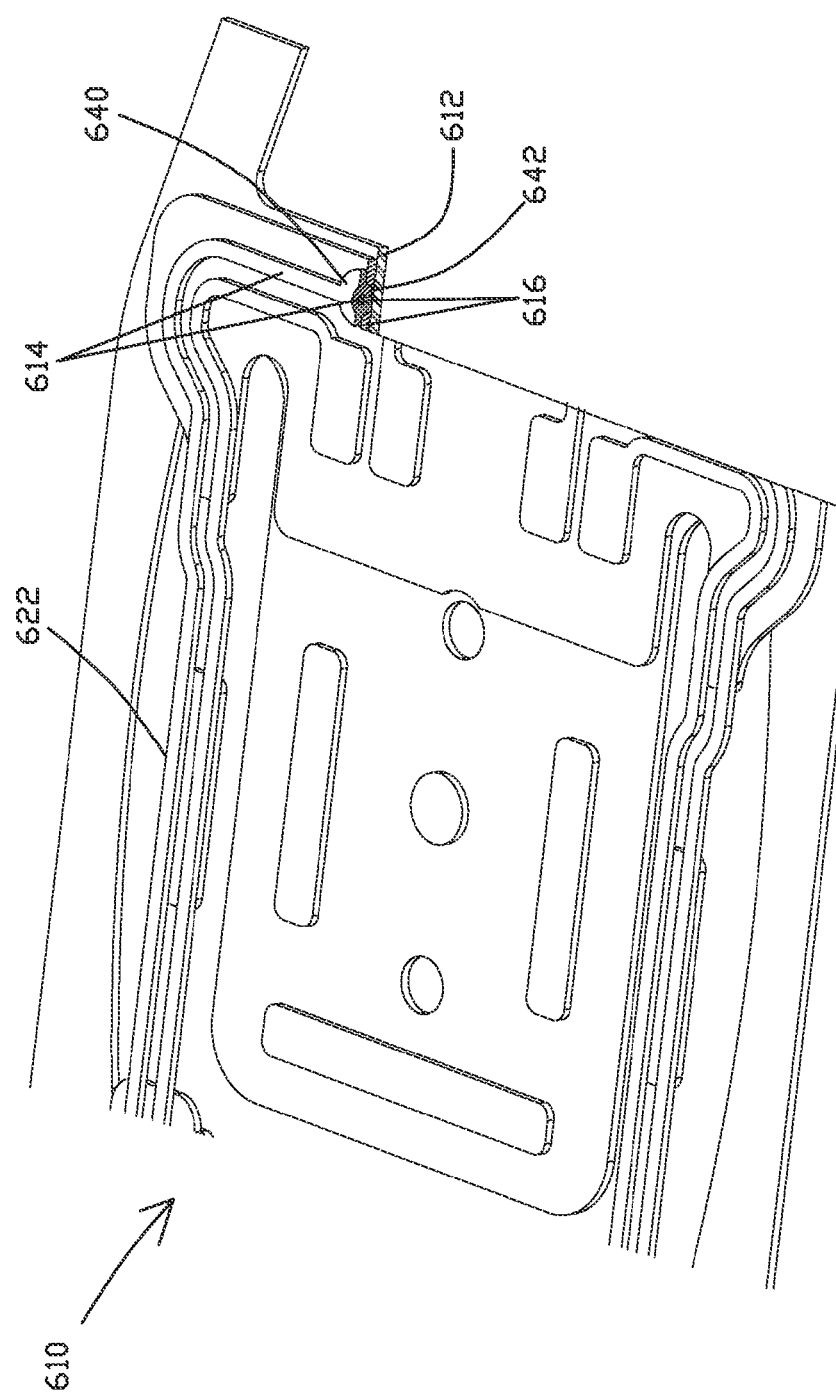
FIG. 16 is a cross sectional and isometric illustration of a first side portion of the flexure and electrical interconnect shown in FIG. 15.

FIGS. 15 and 16 illustrate an interconnect 640 in accordance with yet another embodiment of the present invention. The interconnect 640 is a "copper side" interconnect. In the embodiment shown in FIGS. 15 and 16, the interconnect 640 is formed in an aperture 642 created only in the insulator layer 616. In other words, in contrast to the interconnect 240 shown in FIGS. 6-8, where the manufacture of the conductor layer 214 includes forming the portion of the aperture 242 that extends through the conductor layer 214, the conductive layer 614 shown in FIGS. 15 and 16 does not include the aperture. The exposed surfaces of the conductor layer 614 are plated with a relatively non-corrosive conductive metal 644. In one embodiment, the non-corrosive conductive metal 644 can comprise gold. In another embodiment, a thin layer of nickel (not shown) can be plated on the non-corrosive conductive metal 644. In another embodiment where the conductor layer 614 comprises a relatively non-corrosive metal, the invention does not include the plating 644. An electroplated nickel or other conductive material interconnect plating 646 is built up or plated up over the spring metal layer 612 in the region of the aperture 642 so that the interconnect plating 646 forms an electrical contact with the adjacent portion of the conductor layer 614. In the embodiment shown, the electrical contact is through the plating 644. A layer of gold plating 650 can be applied to the interconnect 640, as shown in FIG. 15, but need not be present in other embodiments (not shown). In the embodiment shown in FIGS. 15 and 16, the interconnect plating 646 forms an interconnect 640 covering the aperture 642, a portion of the conductor layer 614, and portions of the insulator layer 616 adjacent to the aperture 642. In other embodiments, the interconnect plating 646 need not extend over the insulator layer 616.

Figure 17:
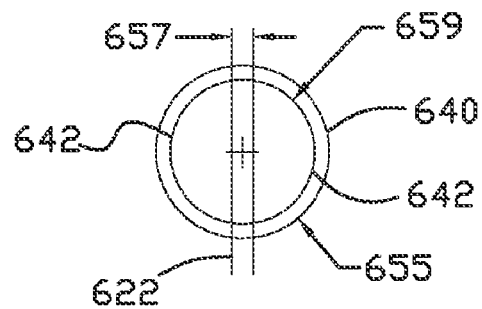
FIG. 17 is a top view of the interconnect of FIGS. 15 and 16.

FIG. 17 is a top view of the interconnect 640 of FIGS. 15 and 16. As can be seen from FIG. 17, the interconnect 640 has a generally circular shape and is centered on a portion of the trace 622. The aperture 642 has a generally circular shape. The interconnect 640 and aperture 642 need not be generally circular, but can take any desired shape. The size and shape of the interconnect 640 are determined by the interconnect plating mask. In one embodiment, the interconnect 640 has a generally circular shape with a diameter 655 between approximately 180 and 240 micrometers and is centered on a trace having a width 657 between approximately 30 and 40 micrometers. The aperture 642 has a generally circular shape with a diameter 659 between approximately 140 and 200 micrometers.

Figure 18:
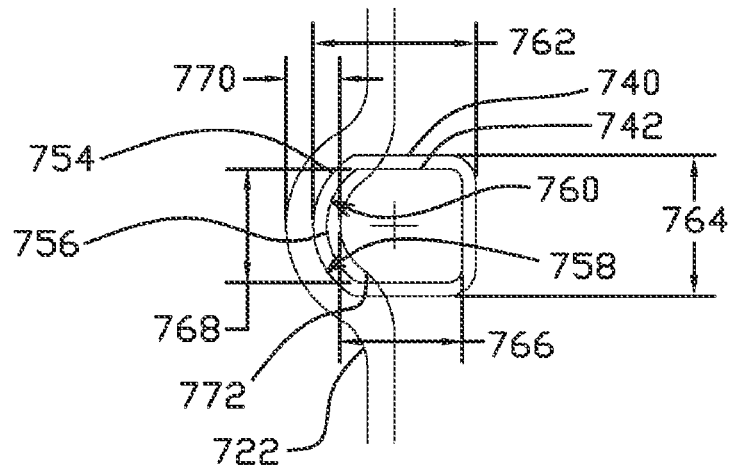
FIG. 18 is a top view of an alternative embodiment of the interconnect of FIGS. 15-17.
Figure 19:
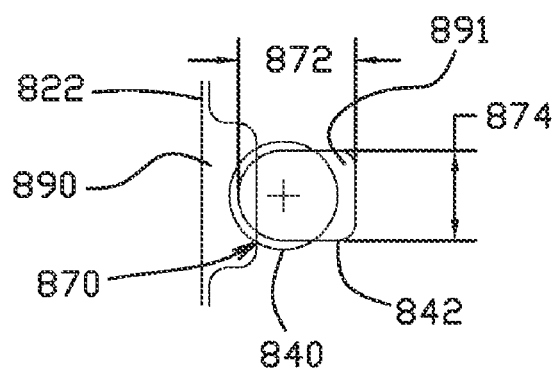
FIG. 19 is a top view of another alternative embodiment of the interconnect of FIGS. 15-17.

FIGS. 18 and 19 depict additional embodiments of the interconnect 640. Many of the features shown in FIGS. 18 and 19 are similar to those shown in FIGS. 15-17, and similar features are designated by similar reference numbers preceded by the number 700 and 800, respectively. In the embodiment shown in FIG. 18, the interconnect 740 is located adjacent to and partially covers the trace 722. The interconnect 740 and aperture 742 have generally rectangular shapes. Side 754 and side 756 of the interconnect 740 and aperture 742, respectively, have radii 758, 760. In other embodiments, the interconnect 740 and aperture 742 need not have radii. In the embodiment of FIG. 18, the interconnect side 754 is adjacent to and partially covers the trace 722, but in other embodiments, other sides of the interconnect 740 could be adjacent to and partially cover the trace 722. In yet another embodiment, the interconnect 740 could be centered over the trace 722. The interconnect 740 has a length 762 and a width 764. The aperture 742 has a length 766 and a width 768. The trace 722 has a thickness 770 and a radius 772.

In one embodiment, the interconnect 740 has a length 762 between approximately 180 and 205 micrometers and a width 764 between approximately 180 and 205 micrometers. In one embodiment, the aperture 742 has a length 766 between approximately 150 and 175 micrometers and a width 768 between approximately 150 and 175 micrometers. The radii 758, 760 can be between approximately 75 and 105 micrometers. In one embodiment, the trace 722 has a thickness 770 between approximately 40 and 80 micrometers and a radius 772 between approximately 50 and 90 micrometers.

FIG. 19 shows yet another alternative embodiment of the interconnect of FIGS. 15-17. The interconnect 840 has a generally circular shape and is located adjacent to and partially covering a copper pad 890. The aperture 842 has a generally rectangular shape and is located adjacent to and partially overlapping the pad 890. In the embodiment shown in FIG. 18, the aperture 842 is larger than the interconnect 840 and is offset to the side with respect to the interconnect 840, leaving a space 891. This design provides certain advantages when plating the interconnect 840. The space 891 increases the exposure of the spring metal layer 812 during a cathodic, an anodic, or other cleaning step. The space 891 also increases the exposure of the spring metal layer 812 during the initial plating of the interconnect plating 846. Increasing the exposure of the spring metal layer 812 during the cleaning and initial interconnect plating can result in better initial adhesion of the interconnect plating 846 to the spring metal layer 812. In other embodiments, the aperture 842 need not be larger than the interconnect 840.

The pad 890 shown in FIG. 18 has a generally rectangular shape. In this embodiment, the pad 890 is formed by widening out a trace 822 in the region of the interconnect 840. The pad 890 aids in formation of the interconnect 840 by increasing the area of conductor layer 814 available for the interconnect plating 846. In one embodiment, the interconnect 840 has a diameter 870 between 180 and 240 micrometers and the aperture 842 has a length 872 between 150 and 204 micrometers and a width 874 of between 150 and 204 micrometers. In other embodiments, the interconnect 840 may be plated onto the trace 822 itself, or onto any other feature in the conductive layer 814.

Although specific shapes and dimensions have been given with respect to the interconnects 640, 740, and 840, interconnects having any desired shape and dimension can be created by changing the plating mask used to create the interconnects. In alternative embodiments, the apertures 642, 742, and 842, and conductive layers 614, 714, and 814 can have any desired shape, form, or dimensions for creating an electrical interconnect between a spring metal layer and a conductor layer.

Figure 20:
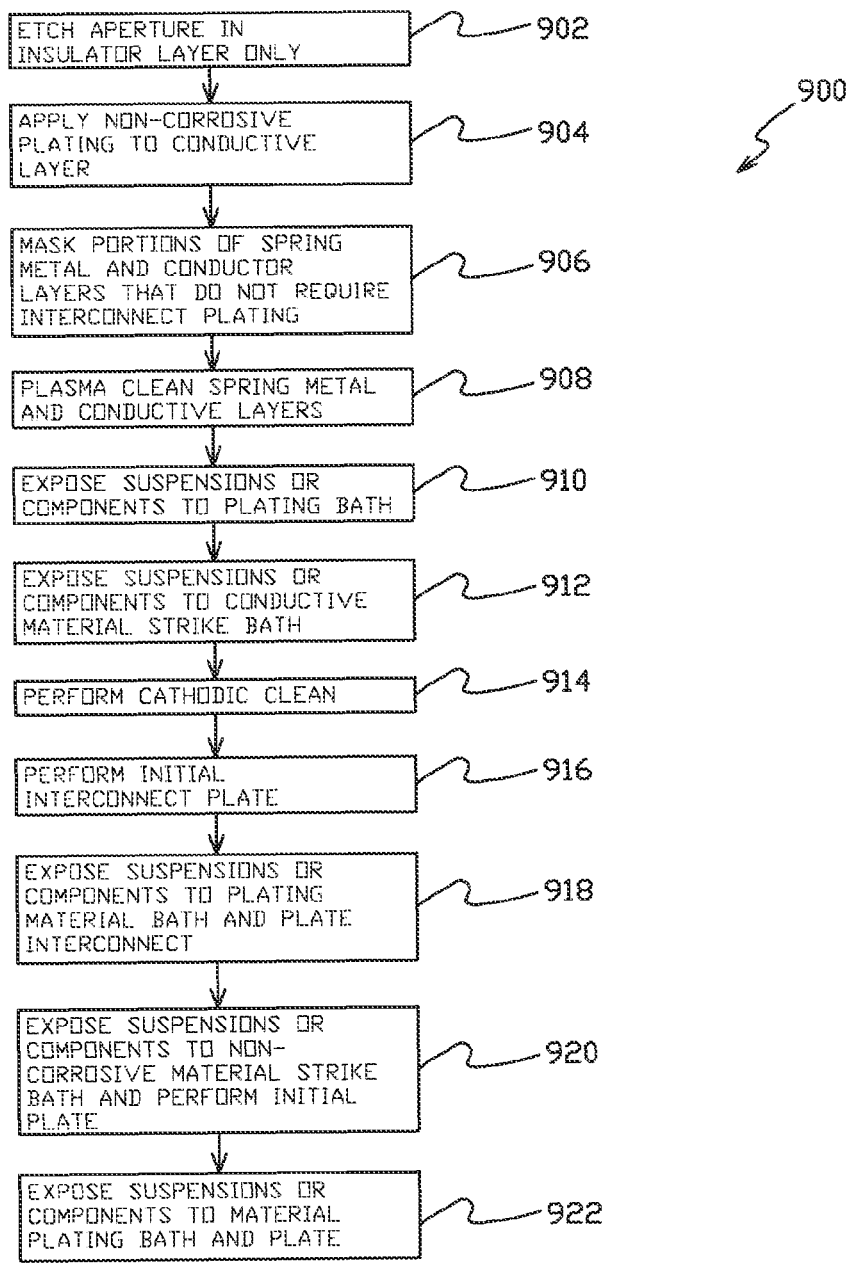
FIG. 20 is a block diagram illustration of an exemplary process for forming the interconnects shown in FIGS. 15-19.

FIG. 20 is a flowchart describing a process 900 by which interconnect 640 can be formed in a flexure 610. The etching, masking, plating, and cleaning processes used during the interconnect forming process 900 generally can correspond to those discussed above with respect to the interconnect forming process 500. The interconnect forming process 900 includes etching or otherwise forming the gap or aperture 642 only in the insulator layer 616, and not in the conductor layer 614 (step 902). In the embodiment shown in FIG. 15, the undercutting aspect of the process of etching the aperture 642 results in the curved shape of the remaining portion 652 of the insulator layer 616 underneath the conductor layer 614. In other embodiments, the insulator layer 616 is completely removed during the etching process. After the aperture 642 is formed, a non-corrosive plating 644 can be applied to the exposed surfaces of the conductor layer 614 if desired using conventional electroplating processes (step 904). An interconnect plating mask (not shown) is applied to the flexure at step 906 to all exposed and electrically interconnected portions of the leads 622 and the spring metal layer 612 where the interconnect plating 646 is not desired.

The masked suspension components can then be plasma cleaned as indicated by step 908. Additional cleaning by immersing the masked suspension components in an acid bath can also be performed (step 910). The interconnect 646 can then be formed. Any oxide that may have formed on the spring metal region can be removed using a conductive plating material strike bath (step 912). A cathodic cleaning step 914 can also be performed. A thin layer of interconnect material 646 is plated as shown in step 916. Typically, the suspension components will be removed from the plating strike bath and rinsed after the initial interconnect plate of 916. Then, the interconnect forming process 900 continues with the submersion of the suspension components in a plating material bath as indicated at step 918. Electric current is applied to the spring metal layer 612 in such a manner as to cause interconnect plating 646 to plate onto the exposed portions of the spring metal layer 612. The thickness of the interconnect plating 646 will continue to increase with continued plating. The interconnect plating 646 will build up on the spring metal layer 612 to a thickness where it will contact the exposed conductor layer 614. This contact creates an electrical connection between the interconnect plating 646 and the conductor layer 614. Continued plating will cause the interconnect plating 646 to plate onto and build up on the exposed portions of the conductor layer 614 at the interconnect site. When step 918 is completed, suspension components will typically be withdrawn from the plating bath and rinsed before further processing steps are performed.

At step 920, an initial layer of gold plating 650 can be applied by electroplating a thin layer of gold onto the interconnect plating 646. The suspension components are then subjected to a strike bath (step 920) and then a thicker layer of gold electroplated onto the interconnect plating in a plating bath (step 922). After the interconnects are formed, the interconnect masks can then be removed using conventional masking and photolithography processes. Although the interconnect forming process 900 is discussed with reference to the interconnect 640, the interconnect forming process 900 can also be used to form other interconnects, for example, interconnects 740 and 840.

Electrical interconnects in accordance with the present invention offer a number of important advantages. Electrical resistances in the range of about 0.02 ohms have been observed, resistances that are considerably below those of other interconnects such as those formed by conductive epoxy. Considerably larger currents can therefore be conducted by the interconnect without overheating. Electroless and sputtered seed layers are not required. The size and footprint of the interconnect is relatively small. The interconnect is also mechanically strong. Furthermore, it need not be covered by a covercoat to prevent particulate contamination.

Although the present invention has been described with reference to preferred embodiments, those skilled in the art will recognize that changes can be made in form and detail without departing from the spirit and scope of the invention.

What is claimed is:

1. In an integrated lead suspension or suspension component of the type having a conductive spring metal layer, a conductive lead layer, and an insulator layer between at least portions of the spring metal and conductive lead layers, an electrical interconnect between the spring metal and conductive lead layers, including:

an aperture through only the insulator layer at an interconnect site; and an electroplated conductive material interconnect extending between both the spring metal layer and the conductive lead layer at the interconnect site.

2. The electrical interconnect of claim 1 wherein the electroplated conductive material interconnect includes conductive material plated over the conductive lead layer and an interior surface of the spring metal layer and built up to extend into plated electrical contact with an interior surface layer of the conductive lead layer at the interconnect site.

3. The electrical interconnect of claim 1 wherein the electroplated conductive material interconnect covers a portion of the insulator layer material adjacent to the aperture.

4. The electrical interconnect of claim 1 wherein the conductive lead layer includes a trace and the electroplated conductive material interconnect covers a portion of and is centered over the trace.

5. The electrical interconnect of claim 1 wherein the conductive lead layer includes a trace and the electroplated conductive material interconnect covers a portion of and is laterally displaced with respect to the trace.

6. The electrical interconnect of claim 1 wherein the conductive lead layer comprises a pad formed by widening a trace at the interconnect site.

7. The electrical interconnect of claim 6 where in the electroplated conductive material interconnect covers a portion of the pad.

8. The electrical interconnect of claim 1 wherein the conductive lead layer includes a trace and the electroplated conductive material interconnect is smaller than the aperture and is laterally displaced with respect to the trace.

9. The electrical interconnect of claim 1 wherein the electroplated conductive material interconnect has a generally circular shape and the aperture has a generally circular shape.

10. The electrical interconnect of claim 9 wherein the electroplated conductive material interconnect has a diameter between approximately 180 to 240 micrometers and the aperture has a diameter between approximately 140 to 200 micrometers.

11. The electrical interconnect of claim 1 wherein the electroplated conductive material interconnect has a generally rectangular shape and the aperture has a generally rectangular shape.

12. The electrical interconnect of claim 11 wherein the electroplated conductive material interconnect has a length between approximately 180 and 205 micrometers and a width between approximately 180 and 205 micrometers and the aperture has a length between approximately 150 and 175 micrometers and a width between approximately 75 and 105 micrometers.

13. The electrical interconnect of claim 1 wherein the electroplated conductive material interconnect has a generally circular shape and the aperture has a generally rectangular shape.

14. The electrical interconnect of claim 13 wherein the electroplated conductive material interconnect has a diameter between approximately 180 and 240 micrometers and the aperture has a length between approximately 150 and 204 micrometers and a width between approximately 150 and 204 micrometers.

15. The electrical interconnect of claim 3 wherein the electroplated conductive material interconnect includes conductive material plated over the conductive lead layer and an interior surface of the spring metal layer and built up to extend into plated electrical contact with an interior surface layer of the conductive lead layer at the interconnect site.

16. The electrical interconnect of claim 15 wherein the conductive lead layer includes a trace and the electroplated conductive material interconnect covers a portion of and is centered over the trace.

17. The electrical interconnect of claim 15 wherein the conductive lead layer includes a trace and the electroplated conductive material interconnect covers a portion of and is laterally displaced with respect to the trace.

18. The electrical interconnect of claim 15 wherein the conductive lead layer includes a trace and the electroplated conductive material interconnect is smaller than the aperture and is laterally displaced with respect to the trace.

* * * * *